United States Patent Office 3,734,730

Patented May 22, 1973

3,734,730

POLYMETAL PRINTING PLATES

Rexford W. Jones and William B. Thompson, Columbus, Ohio, assignors to A. E. Staley Manufacturing Company, Decatur, Ill.

No Drawing. Continuation-in-part of applications Ser. No. 796,897, Feb. 5, 1969, now abandoned, Ser. No. 833,771, June 16, 1969, now Patent No. 3,677,759, Ser. No. 849,520, Aug. 12, 1969, now abandoned, and Ser. No. 123,084, Mar. 10, 1971. This application Sept. 27, 1971, Ser. No. 184,261

Int. Cl. G03c 5/00

U.S. Cl. 96—36.3 10 Claims

ABSTRACT OF THE DISCLOSURE

Method of forming a polymetal printing plate which comprises the steps of exposing a polymetal plate having a thin hydrophilic metal layer disposed over a hydrophobic metal surface, said hydrophilic metal layer bearing a light-sensitive layer capable of developing a $R_d$ of 1.0 to 2.2 to actinic radiation to produce a potential $R_d$ of 1.0 to 2.2; developing said light-sensitive layer with water-insoluble powder particles using physical force to embed the powder particles in the light-sensitive layer; removing non-embedded powder particles; fusing the water-insoluble powder particles to the hydrophilic metal subbing layer by heating; etching the hydrophilic metal layer in the areas unprotected by the fused water-insoluble powder particles and removing the fused water-insoluble powder particles.

This application is a continuation-in-part of applications Ser. Nos. 796,897, now abandoned; 833,771, now U.S. Pat. 3,677,759; 849,520, now abandoned and 123,084 filed Feb. 5, 1969; June 16, 1969; Aug. 12, 1969 and Mar. 10, 1971, respectively.

This invention relates to a method of producing lithographic printing plates. More particularly, this invention relates to a method of making polymetal printing plates.

Until recently, substantially all long run lithographic printing plates have been produced by the so-called deep etch process or from polymetal printing plates. The polymetal plates are of two distinct types. They may have a hydrophobic metal layer disposed over a hydrophilic metal surface or a hydrophilic metal layer disposed over a hydrophobic metal surface. While lithographic printing plates produced by these processes are suitable for printing 500,000 to one million impressions, they have the disadvantages that these processes are relatively time consuming commonly taking from one to two hours to produce each printing plate, and require meticulous care to preserve the temporary resist (sometimes called the stencil), which is usually produced by exposing a dichromated colloid to light. While the tanned dichromated colloid, or in some cases exposed diazo resins are sufficiently hydrophobic that they may form the image areas of conventional lithographic plates, they are water sensitive in the sense that they swell or are dissolved in aqueous treating baths unless appropriate steps are taken to preserve their integrity.

In a typical situation, a polymetal printing plate having a hydrophilic metal layer disposed over a hydrophobic metal surface is prepared by applying a dichromated colloid to the thin hydrophilic layer and exposing the dichromated colloid to actinic radiation through a positive transparency thereby tanning the dichromated colloid in the exposed areas forming a temporary resist or stencil. The unexposed dichromated colloid is removed from the metal base by carefully soaking and scrubbing the imaged plate in an aqueous bath containing salts to prevent the tanned dichromated colloid from dissolving. Then it is washed in anhydrous alcohol to remove the salts from the plate. The unprotected exposed hydrophilic metal areas are etched by placing the metal plate in a suitable etchant bath containing additional salts to prevent the tanned dichromated colloid from dissolving. The tanned dichromated colloid is then removed from the lithographic plate leaving hydrophilic areas and hydrophobic metal substrate. It is readily apparent that this is a time consuming process and it would be desirable to provide a method of producing polymetal printing plates using a water-insoluble stencil.

The principal object of this invention is to provide a new method of producing polymetal printing plates of the type having a thin hydrophilic metal layer disposed over a hydrophobic metal surface. Other objects will appear hereinafter.

In the description that follows, the phrase "powder-receptive, solid, light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. While explained in greater detail below, the $R_d$ of a light-sensitive layer is a photometric measurement of the difference in degree of blackness of undeveloped areas and black powder developed areas. The terms "physically embedded" or "physical force" are used to indicate that the powder particle is subject to an external force other than, or in addition to, either electrostatic force or gravitational force resulting from dusting or sprinkling powder particles on a substrate. The terms "mechanically embedded" or "mechanical force" are used to indicate that the powder particle is subjected to a manual or machine force, such as lateral to-and-fro or circular rubbing or scrubbing action. The term "embedded" is used to indicate that the powder particle displaces at least a portion of the light-sensitive layer and is held in the depression so created, i.e. at least a portion of each particle is below the surface of the light-sensitive layer.

We have now found that the objects of this invention can be attained by:

(1) exposing a polymetal plate having a thin hydrophilic metal layer disposed over a hydrophobic metal surface, said hydrophilic metal layer bearing a light-sensitive layer capable of developing a $R_d$ of 1.0 to 2.2 to actinic radiation to produce a potential $R_d$ of 1.0 to 2.2;

(2) developing said light-sensitive layer with water-insoluble powder particles using physical force to embed the powder particles in the light-sensitive layer;

(3) removing non-embedded powder particles;

(4) fusing the water-insoluble powder particles to the hydrophilic metal subbing layer by heating;

(5) etching the hydrophilic metal layer in the areas unprotected by the fused water-insoluble powder particles; and (6) removing the fused water-insoluble powder particles.

Since the resist or stencil employed in this invention is water-insoluble, it is unnecessary to use salts or other measures to protect the resist during the removal of the unexposed dichromated colloid or during the etching step. Typically, a polymetal printing plate can be produced by this process in 20 minutes as opposed to approximately one hour by conventional techniques.

In somewhat greater detail, a typical method of forming a polymetal printing plate according to the principals of this invention comprises exposing a trimetal plate comprising a steel base bearing a copper subbing layer and chromium layer disposed over said copper subbing layer, said chromium layer bearing a positive-acting, light-sensitive layer capable of developing a $R_{dp}$ of 1.0 to 2.2, to actinic radiation through a negative master to establish a potential $R_{dp}$ of 1.0 to 2.2; physically embedding vinyltoluene-butadiene powder particles in the surface of the light-sensitive layer, fusing the powder particles to the chromium layer by heating; etching the unprotected chromium metal areas in a suitable etching bath and removing fused powder particles with a solvent such as Chlorothene. At this point the plate is ready to go to press. A positive master should be used if a negative working sensitizer is employed.

For use in this invention, the solid, light-sensitive organic layer, which can be an organic material in its naturally occurring or manufactured form or a mixture of said organic material with plasticizers and/or photoactivators for adjusting the powder receptivity and sensitivity to actinic radiation, must be capable of developing a predetermined contrast or $R_d$ using a suitable black developing powder under the conditions of development. The powder-receptive areas of the layer (unexposed areas of a positive-acting, light-sensitive layer or the exposed areas of a negative-acting material) must have a softness such that suitable particles can be embedded into a stratum at the surface of the light-sensitive layer by mild physical forces. However, the layer should be sufficiently hard that film transparencies can be pressed against the surface without the surfaces sticking together or being damaged even when heated slightly under high intensity light radiation. The light-sensitive layer should also have a degree of toughness so that it maintains its integrity during development. If the $R_d$ of the light-sensitive layer is below about 1.0, the light-sensitive layer is too hard to accept a suitable concentration of particles to produce a resist suitable for producing a full range printing plate. On the other hand, if the $R_d$ is above about 2.2, the light-sensitive layer is so soft that it is difficult to maintain film integrity during physical development. Further, if the $R_d$ is above 2.2, the light-sensitive layer is so soft that the layer may be displaced by mechanical forces resulting in distortion or destruction of the image. Accordingly, for use in this invention the light-sensitive layer must be capable of developing a $R_d$ within the range of 1.0 to 2.2 using a suitable black developing powder under the conditions of development.

The $R_d$ of the positive-acting, light-sensitive layer, which can be called $R_{dp}$, is a photometric measurement of the reflection density of a black powder developed light-sensitive layer after a positive-acting, light-sensitive layer has been exposed to sufficient actinic radiation to convert the exposed areas into a substantially powder-non-receptive state (clear the background). The $R_d$ of a negative-acting, light-sensitive layer, which is called $R_{dn}$, is a photometric measurement of the reflection density of a black powder developed area, after a negative-acting, light-sensitive layer has been exposed to sufficient radiation to convert the exposed area into a powder-receptive area.

In somewhat greater detail, the reflection density of the solid, positive-acting, light-sensitive layer ($R_{dp}$) is determined by coating the light-sensitive layer on a white substrate, exposing the light-sensitive layer to sufficient actinic radiation image-wise to clear the background of the solid, positive-acting, light-sensitive layer, applying a black powder (prepared from 77% Pliolite VTL and 23% Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100% reflection of incident light or an equivalent density scale, such as on Model 500A photometer of the Photovolt Corporation. The instrument is zeroed (0 density; 100% reflectance) on a powder free non-image area of the light-sensitive organic layer and an average $R_d$ reading is determined from the powder developed area. The reflection density is a measure of the degree of blackness of the developed surface which is relatable to the concentration of particles per unit area. The reflection density of a solid, negative-acting, light-sensitive layer ($R_{dn}$) is determined in the same manner except that the negative-acting, light-sensitive layer is exposed to sufficient actinic radiation to convert the exposed area into a powder-receptive state.

Although the $R_d$ of all light-sensitive layers is determined by using the aforesaid black developing powder and a white substrate, the $R_d$ is only a measure of the suitability of a light-sensitive layer for use in this invention.

Since the $R_d$ of any light-sensitive layer is dependent on numerous factors other than the chemical constitution of the light-sensitive layer, the light-sensitive layer is best defined in terms of its $R_d$ under the development conditions of intended use. The positive-acting, solid, light-sensitive organic layers useful in this invention must be powder receptive in the sense that the aforesaid black developing powder can be embedded as a monoparticle layer into a stratum at the surface of the unexposed layer to yield a $R_{dp}$ of 1.0 to 2.2 under the predetermined conditions of development and light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting light-sensitive layers are apparently converted into the powder-non-receptive state by a light-catalyzed hardening action, such as photopolymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of the vinylidene groups of polyvinylidene monomers alone or together with polymeric materials. The latter require special precautions, such as storage in oxygen-free atmosphere or oxygen-impermeable cover sheets. For this reason, it is preferable to use solid, positive-acting, film-forming, organic materials containing no terminal ethylenic unsaturation.

The negative-acting, solid, light-sensitive organic layers useful in this invention must be light-sensitive in the sense that, upon exposure to actinic radiation, the most exposed areas of the light-sensitive layer are converted from a non-powder-receptive state under the predetermined conditions of development to a powder-receptive state under the predetermined conditions of development. In other words, the negative-acting, light-sensitive layer must have a certain minimum light-sensitivity and potential powder receptivity. The negative-acting, light-sensitive layers are apparently converted into the powder receptive state by a light-catalyzed softening action, such as photo-depolymerization.

In general, the positive-acting, solid, light-sensitive layers useful in this invention comprise a film-forming organic material in its naturally occurring or manufactured form or a mixture of said organic material with plasticizers and/or photoactivators for adjusting powder receptivity and sensitivity to actinic radiation. Suitable positive-acting, film-forming organic materials which are not inhibited by oxygen, include internally ethylenically unsaturated acids, such as abietic acid, rosin acids, partially hydrogenated rosin acids, such as those sold under the name Staybelite resin, wood rosin, etc., esters of internally ethylenically unsaturated acids, methylol amides of maleated oils such as described in U.S. Pat. 3,471,466, phosphatides of the class described in application Ser. No.

796,841, now abandoned filed on Feb. 5, 1969 in the name of Hayes, such as soybean lecithin, partially hydrogenated lecithin, dilinolenyl-alpha-lecithin, etc., partially hydrogenated rosin acid esters, such as those sold under the name Staybelite esters, rosin modified alkyds, etc.; polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins, such as coumarone-indene resins, etc.; halogenated hydrocarbons, such as chlorinated waxes, chlorinated polyethylene, etc. Positive-acting, light-sensitive materials, which are inhibited by oxygen include mixtures of polymers, such as polyethylene terephthalate/sebacate, or cellulose acetate or acetate/butyrate, with polyunsaturated vinylidene monomers, such as ethylene glycol diacrylate or dimethacrylate, tetraethylene glycol diacrylate or dimethacrylate, etc.

Although numerous positive-acting, film-forming organic materials have the requisite light-sensitivity and powder receptivity at predetermined development temperatures, it is generally preferable to compound the film-forming organic material with photoactivator(s) and/or plasticizer(s) to impart optimum powder-receptivity and light-sensitivity to the light-sensitive layer. In most cases, the light-sensitivity of an element can be increased many fold by incorporation of a suitable photoactivator capable of producing free radicals, which catalyze the light-sensitive reaction and reduce the amount of photons necessary to yield the desired physical change.

Suitable photoactivators capable of producing free-radicals include benzil, benzoin, Michlers ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino-3-pyradil)methane, metal naphthanates, N-methyl-N-phenylbenzylamine, pyridil, 5-7 dichloroisatin, azodiisobutyronitrile, trinitroanisole, chlorophyll, isatin, bromoisatin, etc. These compounds can be used in a concentration of .001 to 2 times the weight of the film-forming organic material (.1%–200% the weight of the film former). As in most catalytic systems, the best photoactivator and optimum concentration thereof is dependent upon the film-forming organic material. Some photoactivators respond better with one type of film former and may be useful over rather narrow concentration ranges whereas others are useful with substantially all film-formers in wide concentration ranges.

The acyloin and vicinal diketone photoactivators, particularly benzil and benzoin are preferred. Benzoin and benzil are effective over wide concentration ranges with substantially all film-forming light-sensitive organic materials. Benzoin and benzil have the additional advantage that they have a plasticizing or softening effect on film-forming light-sensitive layers, thereby increasing the powder receptivity of the light-sensitive layers. When employed as a photoactivator, benzil should preferably comprise at least 1% by weight of the film-forming organic material (.01 times the film former weight).

Dyes, optical brighteners and light absorbers can be used alone or preferably in conjunction with the aforesaid free-radical producing photoactivators (primary photoactivators) to increase the light-sensitivity of the light-sensitive layers of this invention by converting light rays into light rays of longer lengths. For convenience, these secondary photoactivators (dyes, optical brighteners and light absorbers) are called "super-photoactivators." Suitable dyes, optical brighteners and light absorbers include 4-methyl-7-dimethylaminocoumarin, Calcofluor yellow HEB (preparation described in U.S. Pat. 2,415,373), Calcofluor white SB super 30080, Calcofluor, Uvitex W conc., Uvitex TXS conc., Uvitex RS (described in Textil-Rundschau 8 [1953], 339), Uvitex WGS conc., Uvitex K, Uvitex CF conc., Uvitex W (described in Textil-Rundschau 8 [1953], 340), Aclarat 8678, Blancophor OS, Tenopol UNPL, MDAC S–8844, Uvinul 400, Thilflavin TGN conc., Aniline yellow S (low conc.)., Seto flavine T 5506–140, Auramine O, Calcozine yellow OX, Calcofluor RW, Calcofluor GAC, Acetosol yellow 2 RLS–PHF, Eosine bluish, Chinoline yellow P conc., Ceniline yellow S (high conc.), Anthracene blue Violet fluorescence, Calcofluor white MR, Tenopol PCR, Uvitex GS, Acid-yellow-T supra, Acetosol yellow 5 GLS, Calcocid OR, Y, Ex. Conc., diphenyl brilliant flavine 7 GFF, Resoflorm fluorescent yellow 3 CPI, Eosin yellowish, Thiazole fluorescor G, Pyrazalone organe YB–3, and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these materials and proportions can be determined by simple experimentation.

As indicated above, plasticizers can be used to impart optimum powder receptivity to the light-sensitive layer. With the exception of lecithin, most of the film-forming, light-sensitive organic materials useful in this invention are not powder-receptive at room temperature but are powder-receptive above room temperature. Accordingly, it is desirable to add sufficient plasticizer to impart room temperature (15 to 30° C.) or ambient temperature powder receptivity to the light-sensitive layers and/or broaden the $R_{dp}$ range of the light-sensitive layers.

While various softening agents, such as dimethyl siloxanes, dimethyl phthalate, glycerol, vegetable oils, etc. can be used as plasticizers, benzil and benzoin are preferred since, as pointed out above, these materials have the additional advantage that they increase the light-sensitivity of the film-forming organic materials. As plasticizer-photoactivators, benzoin and benzil are preferably used in a concentration of 10% to 80% by weight of the film-forming solid organic material.

The preferred positive-acting, light-sensitive film formers containing no conjugated terminal ethylenic unsaturation include the esters and acids of internally ethylenically unsaturated acids, particularly the phosphatides, rosin acids, partially hydrogenated rosin acids and the partially hydrogenated rosin esters. These materials, when compounded with suitable photoactivators, preferably acyloins or vicinal diketones together with superphotoactivators are relatively fast and can be developed to yield water-insoluble powder resist patterns having the desired configuration.

In general, the negative-acting, light-sensitive layers useful in this invention comprise a film-forming organic material in its naturally occurring or manufactured form, or a mixture of said organic material with plasticizers and/or photoactivators for adjusting powder receptivity and sensitivity to actinic radiation. Suitable negative-acting, film-forming organic materials include n-benzyl linoleamide, dilinoleyl-alpha-lecithin, castor wax (glycerol 12-hydroxy-stearate), ethylene glycol monohydroxy stearate, polyisobutylene, polyvinyl stearate, etc. Of these castor wax and other hydrogenated ricinoleic acid esters (hydroxystearate) are preferred. These materials can be compounded with plasticizers and/or photoactivators in the same manner as the positive-acting, light-sensitive, film-forming organic materials.

In somewhat greater detail, water-insoluble image areas are produced by applying a thin layer of solid, light-sensitive, film-forming organic material having a potential $R_d$ of 1.0 to 2.2 (i.e. capable of developing a $R_{dp}$ or $R_{dn}$ of 1.0 to 2.2) to a polymetal plate having a thin hydrophilic metal layer disposed over a hydrophobic metal surface by any suitable means dictated by the nature of the film-forming organic material and/or the base (hot melt, draw down, spray, roller coating or air knife, flow, dip, curtain coating, etc.) so as to produce a reasonably smooth homogeneous layer of from 0.1 to 10 microns thick employing suitable solvents as necessary. Suitable plates for use in this invention comprise hydrophobic metal surfaces, preferably copper, bearing a hydrophilic metal layer, such as aluminum, zinc, steel, etc. Generally, these polymetal plates have a base of steel in order to improve the run length of the plate, i.e. prevent the plate breaking from the cylinder at the points of attachment.

The light-sensitive layer must have an average thickness of at least 0.1 micron thick, and preferably at least 0.4 micron, in order to hold water-insoluble powders during development. If the light-sensitive layer is less than 0.1 micron, or the powder diameter is more than 25 times layer thickness, the light-sensitive layer does not hold the powder with the necessary tenacity. In general, as layer thickness increases, the light-sensitive layer is capable of holding larger particles. However, as the light-sensitive layer thickness increases, it becomes increasingly difficult to maintain film integrity during development. Since grained metal plates are preferred, the light-sensitive layer may vary from somewhat less than 0.1 micron in the high spots of the plate to somewhat more than 10 microns in the low spots. In any event, the light-sensitive layer should have an average thickness between 0.1 and 10 microns.

The light-sensitive layers of predetermined thickness are preferably applied to the base from an organic solvent (hydrocarbon, such as hexane, heptane, benzene, etc.; halogenated hydrocarbon, such as chloroform, carbon tetrachloride, 1,1,1-trichloroethane, trichloroethylene, etc.). If desired, the light-sensitive layers can be deposited from suitable aqueous emulsions. The thickness of the light-sensitive layer can be varied as a function of the concentration of the solids dissolved in the solvent.

After the metal base is coated with a suitable solid, light-sensitive organic layer, a latent image is formed by exposing the element to actinic radiation in image-receiving manner in predetermined areas corresponding to an optical pattern for a time sufficient to provide a potential $R_d$ of 1.0 to 2.2. The light-sensitive elements can be exposed to actinic light through a continuous tone, half-tone or line image.

As indicated above, the latent images are preferably produced from positive-acting, light-sensitive layers by exposing the element in image-receiving manner for a time sufficient to clear the background, i.e. render the exposed areas non-powder-receptive. As explained in commonly assigned application Ser. No. 796,897, now abandoned which is incorporated by reference, the amount of actinic radiation necessary to clear the background varies to some extent with developer size and development conditions. Due to these variations it is often desirable to slightly overexpose both positive and negative-acting, light-sensitive elements. Positive-acting sensitizers are used with negative transparencies and negative-acting sensitizers are used with positive transparencies.

After the light-sensitive element is exposed to actinic radiation for a time sufficient to clear the background of the positive-acting, light-sensitive layer or establish a potential $R_{dn}$ of 1.0 to 2.2, a water-insoluble resin powder is applied to the light-sensitive layer. The developing powder, which has a diameter or dimension along one axis of at least 0.3 micron, is applied physically with a suitable force, preferably mechanically, to embed the powder in the light-sensitive layer. The developing powder can be virtually any shape, such as spherical, acicular, platelets, etc. provided it has a diameter along at least one axis of at least 0.3 micron.

Suitable water-insoluble resinous powders include Vinylite VMCH (vinyl chloride-vinyl acetate-maleic anhydride), phenol-formaldehyde resins, epoxy resins, polyamide (nylon) resins, polystyrene resins, acrylic resins, vinyltoluene-butadiene resins, etc. If desired these resinous powders can be pigmented.

The black developing powder for determining the $R_d$ of a light-sensitive layer, which can also be employed as a suitable light-absorbing pigment in this invention is formed by heating about 77% Pliolite VTL (vinyltoluene-butadiene copolymer) and 23% Neo Spectra carbon black at a temperature above the melting point of the resinous carrier, blending on a rubber mill for fifteen minutes and then grinding in a Mikro-atomizer.

The developing powders useful in this invention contain particles having a diameter or dimension along at least one axis from 0.3 to 25 microns, preferably 0.5 to 10 microns, with powders of the order of 1 to 15 microns being best for light-sensitive layers of 0.4 to 10 microns. Maximum particle size is dependent on the thickness of the light-sensitive layer while minimum particle size is indepndent of layer thickness. Electron microscope studies have shown that powders having a diameter 25 times the thickness of the light-sensitive layer cannot be permanently embedded into light-sensitive layers, and generally speaking, best results are obtained where the diameter of the powder particle is less than about 10 times the thickness of the light-sensitive layer. For the most part, particles over 25 microns are not detrimental to image development provided the developing powder contains a reasonable concentration of powder particles under 25 microns, which are less than 25 times, and preferably less than 10 times, the light-sensitive layer thickness.

Although developing powders over 25 microns are not detrimental to image development, the presence of particles under 0.3 micron diameter along all axes can be detrimental. In general, it is preferable to employ developing powders having substantially all powders having a diameter along at least one axis not less than 0.3 micron, preferably more than 0.5 micron, since particles less than 0.3 micron tend to embed in non-image areas. As the particle size of the smallest powder in the developer increases, less exposure to actinic radiation is required to clear the background.

For best results, the developing powder should have substantially all particles (at least 95% by weight) over 1 micron in diameter along one axis and preferably from 1 to 15 microns for use with light-sensitive layers having an average thickness of from 0.4 to 10 microns. In this way, powder embedment in image areas is maximum.

In somewhat greater detail, the developing powder is applied directly to the light-sensitive layer, while the powder receptive areas of said layer are in at most only a slightly soft condition and said layer is at a temperature below the melting point of the layer and powder. The powder is distributed over the area to be developed and physically embedded into the stratum at the surface of the light-sensitive layer, preferably mechanically by force having a lateral component, such as to-and-fro and/or circular rubbing or scrubbing action using a soft pad, fine brush, etc. If desired, the powder may be applied separately or contained in the pad or brush. The quantity of powder is not critical provided there is an excess available beyond that required for full development of the area, as the development seems to depend primarily on particle-to-particle interaction rather than brush-to-surface or pad-to-surface forces to embed a layer of powder particles substantially one particle thick (monoparticle layer) into a stratum at the surface of the light-sensitive layer. Only a single stratum of powder particles penetrates into the powder-receptive areas of the light-sensitive layer even if the light-sensitive layer is several times thicker than the developer particle diameter.

The pad or brush used for development is critical only to the extent that it should not be so stiff as to scratch or scar the film surface when used with moderate pressure with the preferred amount of powder to develop the film. Ordinary absorbent cotton loosely compressed into a pad about the size of a baseball and weighing about 3 to 6 grams is especially suitable. The developing motion and force applied to the pad during development is not critical. The speed of the swabbing action is not critical other than that it affects the time required; rapid movement requiring less time than slow. The preferred mechanical action involved is essentially the lateral action applied in ultrafine finishing of a wood surface by hand sanding or steel wooling.

Hand swabbing is entirely satisfactory, and when performed under the conditions described above, will reproducibly produce the maximum density which the material is capable of achieving. That is, the maximum concentration of particles per unit area will be deposited under the prescribed conditions, dependent upon the physical properties of the material such as softness, resiliency, plasticity, and cohesivity. Substantially the same results can be achieved using a mechanical device for the powder application. A rotating or rotating and oscillating, cylindrical brush or pad may be used to provide the described brushing action and will produce a substantially similar end result, After the application of developing powder, excess powder remains on the surface which has not been sufficiently embedded into, or attached to, the base. This may be removed in any convenient way, as by wiping with a clean pad or brush usually using somewhat more force than employed in mechanical development, by vacuuming, by vibrating, by air doctoring, by air jets, etc., and recovered. For simplicity and uniformity of results, the excess powder usually is blown off using an air gun having an air-line pressure of about 20 to 40 p.s.i. The gun is preferably held at an angle of about 30 to 60 degrees to the surface at a distance of 1 to 12 inches (3 to 8 preferred). The pressure at which the air impinges on the surface is about 0.1 to 3, and preferably about 0.25 to 2, pounds per square inch. Air cleaning may be applied for several seconds or more until no additional loosely held particles are removed. The remaining powder should be sufficiently adherent to resist removal by moderately forceful wiping or other reasonably abrasive action.

The water-insoluble powder image can be converted into a resist or stencil suitable for use in etching step by one of two techniques. On the one hand, the water-insoluble developing powder particles can be fused to the surface of the metal substrate by heat (preferably at about 250 to 500° F.) and the residual light-sensitive material remaining in the non-image areas (exposed areas of positive-acting, light-sensitive layers and unexposed areas of negative-acting, light-sensitive layers) removed during the etching of the metal substrate. On the other hand, the water-insoluble powder particles can be either fused or sintered to the surface of the metal substrate using either heat or solvent vapors. In this case, the residual light-sensitive material remaining in the non-image areas is removed with a solvent, which is a poor solvent for the remaining (fused or sintered) water-insoluble powder image. If the water-insoluble developing powder was merely sintered by heat or solvent vapor or fused with solvent vapors, it is necessary to heat fuse the powder particles on the metal plate to form the resist or stencil for the etching step. If the water-insoluble resist had been fused by heat prior to the removal of the light-sensitive layer from the non-image areas, it may be desirable to refuse the powder particles with heat in order to remove any occluded solvent from the powder particles thereby enhancing the resistance of the stencil to the etchant.

The polymetal plate bearing the water-insoluble resist is then treated with an appropriate aqueous etchant to remove the thin hydrophilic metal layer from the unprotected areas with a suitable etchant. Any of those currently sold for this purpose may be used, such as a cadmium-catalyzed hydrochloric acid solution.

Since the water-insoluble stencil can form the hydrophobic image areas of a lithographic printing plate it is necessary to remove the resist or stencil with an organic solvent. For example, vinyltoluene-butadiene polymers can be removed with Chlorothene or Cellosolve, vinyl acetate-vinyl chloride copolymers can be removed with methyl ethyl ketone, etc. The particular solvent to be employed can be determined by routine testing.

The polymetal plate is now ready for the press. It takes about 20 minutes to produce this plate as opposed to the present method which takes about one hour. If desired, the plate may be gummed prior to going to press.

The following examples are merely illustrative and should not be construed as limiting the scope of this invention.

EXAMPLE I

A stainless steel plate bearing a copper subbing layer and a chromium layer disposed over the copper layer (approximately 1 mil of copper and .05 mil chromium) sold under the name Lithure, was washed with water in order to remove the protective gum on the chromium layer and dried. The chromium surface was flow coated with a solution comprising 1.7 grams Staybelite Ester #10 (partially hydrogenated rosin ester of glycerol), .51 gram benzil and .255 gram 4-methyl-7-dimethylaminocoumarin, dissolved in 100 mls. Chlorothene (1,1,1-trichloroethane) and air dried. The plate was placed in contact with a negative transparency in a vacuum frame equipped with a mercury vapor point light source, and exposed to light for 2½ minutes. The plate was developed with Pliolite VTL (vinyltoluene-butadiene polymer) of about 1 to 15 microns in diameter using physical force embedding the powder into the unexposed areas and non-embedded powder was removed by blowing with air and wiping with a pad. The plate was heated fused in an oven at 177° C. for two minutes and the light-sensitive coating in the non-image areas was removed by flushing and wiping with isopropanol. After the plate was refused in the oven at 177° C. for two minutes, the chromium layer in the unprotected areas was removed by swabbing with a cadmium-catalyzed hydrochloric solution, such as Harris Chromium Etch M–120, to bare the copper subbing layer and rinsed with water. The Pliolite VTL stencil was then removed with Chlorothene. Total processing time to produce a plate ready to go to press was 20 minutes.

Essentially the same results are obtained by replacing the Staybelite ester composition described above with (1) 1.87 grams Staybelite Ester #5 (partially hydrogenated rosin ester of glycerol), .28 gram benzil and .47 gram 4-methyl-7-dimethylaminocoumarin, dissolved in 100 mls. Chlorothene, (2) 1.87 grams Staybelite resin F (partially hydrogenated rosin acid), .15 gram benzil and .47 gram 4-methyl-7-dimethylaminocoumarin, dissolved in 100 mils. Chlorothene, (3) 1.87 grams wood rosin, .23 gram benzil and .47 gram 4-methyl-7-diethylaminocoumarin, dissolved in 100 mls. Chlorothene, and (4) 1.87 grams Chlorowax 70 LMP, .45 gram benzil and .47 gram 4-methyl-7-dimethylaminocoumarin, dissolved in 100 mls. Chlorothene.

EXAMPLE II

Example I was repeated with essentially the same results except that the Pliolite VTL was replaced with Vinylite VMCH (vinyl chloride-vinyl acetate-maleic anhydride) of about 1 to 15 microns in diameter and the stencil removed with methyl ethyl ketone.

EXAMPLE III

Example II was repeated with essentially the same results except that the isopropanol in the wash-off step was replaced with a mixture of 10 cc. water and 90 cc. Chlorothene.

EXAMPLE IV

Example I was repeated with essentially the same results except that the wash-off of the light-sensitive coating in the unprotected areas with isopropanol was omitted and the second fusing step was omitted.

EXAMPLE V

When Example I is repeated replacing the positive-acting sensitizer composition with a negative-acting light-sensitive composition comprising 2.25 grams Paracin 15 (ethylene glycol monohydroxy stearate), 0.3 gram benzil and 0.3 gram 4-methyl-7-dimethylaminocoumarin dissolved in 100 mls. of Chorothene and a positive transparency replacing the negative transparency, essentially the same results are obtained.

Since many embodiments of this invention may be made and since many changes may be made in the embodiments described, the foregoing is to be interpreted as illustrative only and this invention is defined by the claims appended hereafter.

What is claimed is:

1. The method of forming a polymetal printing plate which comprises the steps of:

(1) exposing a polymetal plate having a thin hydrophilic metal layer disposed over a hydrophobic metal surface, said hydrophilic metal layer bearing a light-sensittve layer capable of developing a $R_d$ of 1.0 to 2.2 to actinic radiation to produce a potential $R_d$ of 1.0 to 2.2;

(2) developing said light-sensitive layer with water-insoluble, resinous powder particles using physical force to embed the powder particles in the light-sensitive layer;

(3) removing non-embedded powder particles;

(4) fusing the water-insoluble powder particles to the hydrophilic metal subbing layer by heating;

(5) etching the hydrophilic metal layer in the areas unprotected by the fused water-insoluble powder particles; and (6) removing the fused water-insoluble powder particles.

2. The process of claim 1, wherein said hydrophilic metal layer is chromium and said hydrophobic metal surface is copper.

3. The method of forming a polymetal printing plate comprising the steps of:

(1) exposing a polymetal plate having a thin hydrophilic metal layer disposed over a hydrophobic metal surface, said hydrophilic metal layer bearing a positive-acting light-sensitive layer capable of developing a $R_{dp}$ of 1.0 to 2.2 to actinic radiation through a negative master to produce a potential of $R_{dp}$ of 1.0 to 2.2;

(2) developing said light-sensitive layer with water-insoluble, resinous powder particles using physical force to embed the powder particles as a monolayer in the light-sensitive layer;

(3) removing non-embedded powder particles;

(4) fusing the water-insoluble powder particles to the hydrophilic metal subbing layer by heating;

(5) etching the hydrophilic metal layer in the areas unprotected by the fused water-insoluble powder particles; and (6) removing the fused water-insoluble powder particles.

4. The process of claim 3, wherein the light-sensitive layer in the exposed areas is removed from the surface of the hydrophilic metal layer with a poor solvent for the remaining powder particles after the non-embedded powder particles are removed.

5. The process of claim 3, wherein the water-insoluble powder particles are fused or sintered to the hydrophilic metal layer and the light-sensitive layer in the exposed areas is removed from the hydrophilic metal layer with a poor solvent for the remaining powder particles after step 3 and before step 4.

6. The process of claim 3, wherein said positive-acting, light-sensitive layer comprises a film former selected from the group consisting of internally ethylenically unsaturated acids and internally ethylenically unsaturated acid esters.

7. The process of claim 6, wherein said ethylenically unsaturated acid moiety comprises a rosin acid moiety.

8. The process of claim 6, wherein said light-sensitive layer comprises a photoactivator selected from the group consisting of acyloins and vicinal diketones.

9. The process of claim 3, wherein said hydrophilic metal layer is chromium and said hydrophobic metal surface is copper.

10. The method of forming a polymetal printing plate comprising the steps of:

(1) exposing a polymetal plate having a thin hydrophilic metal layer disposed over a hydrophobic metal surface, said hydrophilic metal layer bearing a negative-acting light-sensitive layer capable of developing a $R_{dn}$ of 1.0 to 2.2 to actinic radiation through a positive master to produce a potential $R_{dn}$ of 1.0 to 2.2;

(2) developing said light-sensitive layer with water-insoluble, resinous powder particles using physical force to embed the powder particles as a monolayer in the light-sensitive layer;

(3) removing non-embedded powder particles;

(4) fusing the water-insoluble powder particles to the hydrophilic metal subbing layer by heating;

(5) etching the hydrophilic metal layer in the areas unprotected by the fused water-insoluble powder particles; and (6) removing the fused water-insoluble powder particles.

References Cited

UNITED STATES PATENTS

| | | | |
|---|---|---|---|
| 3,075,866 | 1/1963 | Baker | 96—1 |
| 3,547,627 | 12/1970 | Amidon | 96—1 |
| 3,630,728 | 12/1971 | Tamai | 96—1 |

NORMAN G. TORCHIN, Primary Examiner

J. R. HIGHTOWER, Assistant Examiner

U.S. Cl. X.R.

96—27